(12) United States Patent
Yajima et al.

(10) Patent No.: US 7,204,921 B2
(45) Date of Patent: Apr. 17, 2007

(54) VACUUM APPARATUS AND VACUUM PROCESSING METHOD

(75) Inventors: Taro Yajima, Kanagawa (JP); Minoru Akaishi, Kanagawa (JP); Yoshikuni Horishita, Kanagawa (JP)

(73) Assignee: ULVAC Inc., Chigasaki-shi (JP)

( * ) Notice: Subject to any disclaimer, the term of this patent is extended or adjusted under 35 U.S.C. 154(b) by 91 days.

(21) Appl. No.: 10/657,192

(22) Filed: Sep. 9, 2003

(65) Prior Publication Data
US 2004/0139916 A1 Jul. 22, 2004

(30) Foreign Application Priority Data
Sep. 10, 2002 (JP) .............................. 2002-264182

(51) Int. Cl.
*C23C 14/34* (2006.01)
*C23C 16/00* (2006.01)
*H01J 7/24* (2006.01)

(52) U.S. Cl. .............................. 204/298.08; 204/192.1; 204/192.11; 118/723 R; 323/212; 250/423 R; 250/427; 315/111.21; 315/111.31; 315/111.51; 315/111.81

(58) Field of Classification Search ........... 204/298.08, 204/192.1, 192.11; 118/723 R; 323/212; 250/423 R, 427; 315/111.21, 111.31, 111.51, 315/111.81
See application file for complete search history.

(56) References Cited

U.S. PATENT DOCUMENTS

| 4,851,668 A | * | 7/1989 | Ohno et al. .................. 250/251 |
| 5,308,461 A | * | 5/1994 | Ahonen .................. 204/192.11 |
| 5,793,162 A | * | 8/1998 | Barnes et al. ............ 315/111.21 |
| 6,211,749 B1 | * | 4/2001 | Yuzurihara et al. ......... 333/17.3 |
| 6,252,354 B1 | * | 6/2001 | Collins et al. ........... 315/111.51 |

FOREIGN PATENT DOCUMENTS

| JP | 9-92199 | 4/1997 |
| JP | 9-161704 | 6/1997 |
| JP | 2000-165175 | 6/2000 |

* cited by examiner

*Primary Examiner*—Rodney G. McDonald
(74) *Attorney, Agent, or Firm*—Armstrong, Kratz, Quintos, Hanson & Brooks LLP (57) ABSTRACT

A vacuum apparatus which can easily regenerate plasma is provided. A matching box used in the vacuum apparatus can vary the impedance thereof by varying the magnitudes of the inductance of variable inductance elements. Controlling the magnitude of direct current makes it possible to control the magnitudes of inductance of the variable inductance elements so that it is possible to carry out matching operation at high speed.

4 Claims, 5 Drawing Sheets

VACUUM APPARATUS AND VACUUM PROCESSING METHOD

BACKGROUND OF THE INVENTION

1. Field of the Invention

The present invention relates to a vacuum apparatus, and especially the present invention relates to a vacuum apparatus using an ion gun.

2. Description of the Prior Art

In a film deposition process using an ion gun, there are some representative film deposition methods such as an ion beam sputtering method in which ion beam generated by an ion source (plasma) collides against a target and sputtered particles from a target surface form a film, and an ion assist evaporation method in which thin film material is vaporized by an electron gun and the ion gun assists to form a film, or the like. The ion gun is also used in an ion beam etching method, in which etching is carried out with the use of an ion beam, in addition to the film deposition process.

In these processes, there are, for example, three types of ion guns that are used, which are classified according to a method for generating plasma therein. The representative types of ion guns are an RF ion gun type in which RF (radio frequency) power is applied to generate plasma, a filament type in which plasma is generated by a hot filament, and a hollow cathode type in which DC power is applied to a hollow cathode.

Of these types of ion guns, the RF ion gun type has a significant advantage in that the ion gun uses oxygen gas and can process insulating material for a long time so that the RF ion gun becomes indispensable to a film deposition apparatus and an evaporation apparatus for manufacturing an optical filter or the like, especially for the telecommunication market. A narrow-band filter for communication use, for example, is composed of laminated 100 layers or more $SiO_2$ and $Ta_2O_3$ films so that it takes several tens of hours to form the films. The RF ion gun used in this case needs to have a performance to stably discharge for a long time, as one of the essential requirements.

In the case of ion beam sputtering, a summary of an apparatus using the RF ion gun will be hereinafter described.

Figure 5:
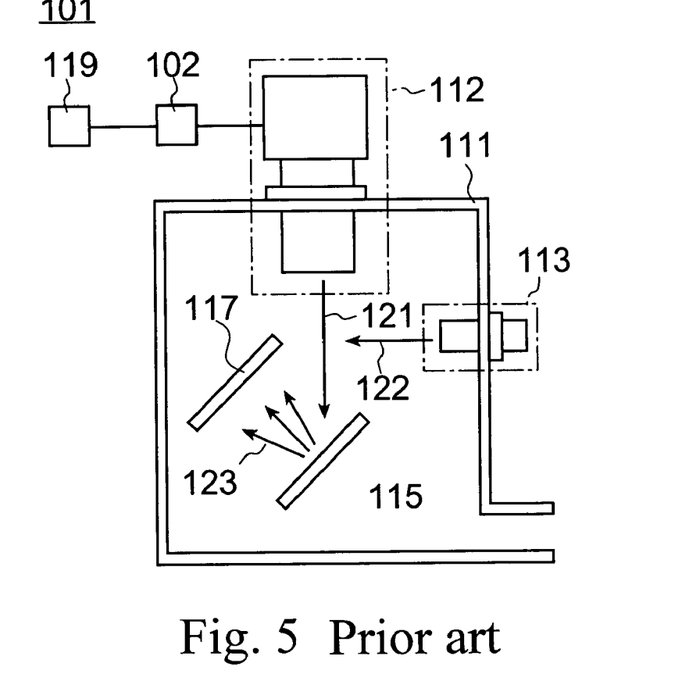
FIG. 5 is a schematic view of a conventional vacuum apparatus.

In FIG. 5, the reference numeral 101 indicates one example of conventional film deposition apparatuses using the RF ion gun. The film deposition apparatus 101 has a vacuum chamber 111.

An RF ion gun 112 and an electron generator (a neutralizer) 113 are provided on the wall of the vacuum chamber 111. The RF ion gun 112 is connected to a power source 119 via a matching box 102.

A target 115 is disposed in the vacuum chamber 111. Starting the power source 119 after air is evacuated from the vacuum chamber 111, power for generating ions is supplied to the RF ion gun 112 via the matching box 102 so that the ions are generated inside the RF ion gun 112.

Consequently, the electron generator 113 is started. When an ion beam 121 is emitted from the RF ion gun 112 with discharging electrons 122 from the electron generator 113, the electrons neutralize positive ions in the ion beam 121. Since neutral particles are applied to the target 115, atoms of the target 115 are sputtered as sputtered particles 123.

A substrate 117, as an object on which a film is to be deposited, is disposed in parallel with the target 115. When the sputtered particles 123 adhere to the substrate 117, a thin film is formed on the surface of the substrate 117.

The impedance inside the foregoing RF ion gun 112 greatly varies between when the ions are generated, and when the ions are stably emitted.

Figure 6:
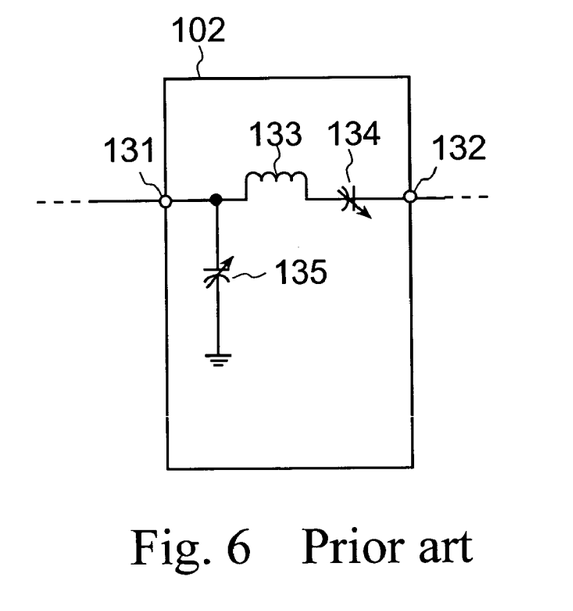
FIG. 6 is a schematic circuit diagram of a matching box of the conventional vacuum apparatus.

Thus, the matching box 102 of a prior art has variable capacitors 134 and 135 as shown in FIG. 6. An input terminal 131 on the side of the power source 119 is grounded via the variable capacitor 135, and is connected to an output terminal 132 on the side of the RF ion gun 112 via a series connected circuit of the other variable capacitor 134 and a coil 133.

In the matching box 102 having the above-discussed structural arrangement, it is possible to vary the impedance of the matching box 102 by varying the capacitance of the variable capacitors 134 and 135.

However, in order to vary the capacitance in the variable capacitors 134 and 135, the electrode composing the capacitor is moved to vary the distance between electrodes. Accordingly, there is the disadvantage that it takes several hundreds milliseconds to several seconds to match the impedance of the matching box 102 to that inside the RF ion gun 112.

Impedance matching speed has not so far been given importance in the film deposition apparatus 101 having the RF ion gun 112. However, recently, in a case of a film deposition process of a narrow-band filter for communication use, for example, continuous film deposition of several tens of hours is necessary; and the film thickness accuracy of ±0.001% is required to laminate 100 or more thin films.

In this case, if generation of plasma is stopped due to the occurrence of arc discharge or the like caused by contamination of the electrode or the like, the matching box 102 with the mechanical variable capacitances takes several seconds or more only to match impedance at restart. Accordingly, even if the RF ion gun 112 is restarted, the produced filter becomes defective because the film deposition is stopped for several seconds or more.

In other words, a significant problem occurs when an accurate film forming process of several tens of hours ends in failure because of only one time of discharge interruption of several seconds. The references relating to the conventional art are follows: JP09-161704A, JP09-92199A and JP2000-165175A.

SUMMARY OF THE INVENTION

The present invention is to solve the foregoing problem of the prior art; and an object of the present invention is to provide a matching box which can control the impedance with high speed. Another object of the present invention is to also provide a vacuum apparatus using the matching box to shorten time for regenerating plasma. Another object of the present invention is to provide a vacuum processing method which can regenerate the plasma with ease.

To achieve the foregoing objects, the present invention is a matching box connected to a plasma generator, for changing a phase of current and/or a phase of voltage of RF power inputted from a RF source and outputting phase-changed RF power to the plasma generator. The matching box includes a variable inductance element, the variable inductance element comprising a main winding for determining impedance of the variable inductance element and a control winding magnetically coupled to the main winding. An impedance of the main winding is controlled based on a magnitude of direct current flowing through the control winding.

Furthermore, the present invention is a matching box having a high voltage side output terminal connected to a plasma generator, an input terminal connected to an RF source, the matching box for changing a phase of current and/or a phase of voltage of RF power inputted into the input terminal and outputting phase-changed RF power to the high voltage side output terminal. The matching box further includes a first variable inductance element, wherein the first variable inductance element comprises a first main winding connected to the input terminal and the high voltage side output terminal, and a first control winding magnetically coupled to the first main winding, wherein an impedance of the first main winding is controlled based on a magnitude of direct current flowing through the first control winding.

Furthermore, the present invention is the matching box further having a first control power source, wherein current is outputted from the first control power source through the first control winding.

Furthermore, the present invention is the matching box wherein the first control power source is connected to a first control circuit, and a signal inputted from the first control circuit changes the magnitude of current outputted to the first control winding.

The present invention is a matching box having a high voltage side output terminal connected to a plasma generator, an input terminal connected to an RF source, a ground side output terminal connected to ground voltage, the matching box changing a phase of current and/or a phase of voltage of RF power inputted into the input terminal and outputting phase-changed RF power from the high voltage side output terminal, and the matching box further comprise a second variable inductance element. The second variable inductance element comprises a second main winding connected to the input terminal and the ground side output terminal, and a second control winding magnetically coupled to the second main winding, wherein the second main winding is controlled based on a magnitude of direct current flowing through the second control winding.

Furthermore, the present invention includes the matching box which has a second control power source, and current from the second control power source flows through the second control winding.

Furthermore, the present invention includes the matching box wherein the second control power source is connected to a second control circuit, and a signal inputted from the second control circuit changes the magnitude of current outputted to the second control winding.

The present invention is a matching box further having a high voltage side output terminal connected to a plasma generator, an input terminal connected to a RF source, a ground side output terminal connected to ground voltage, the matching box changing a phase of current and/or a phase of voltage of RF power inputted into the input terminal and outputting phase-changed RF power from the high voltage side output terminal. The matching box further comprises a second variable inductance element, the second variable inductance element including a second main winding connected to the input terminal and the ground side output terminal, and a second control winding magnetically coupled to the second main winding, wherein the second main winding is controlled based on a magnitude of direct current flowing through the second control winding.

The present invention is a vacuum apparatus having a vacuum chamber, a RF source, a matching box having a variable inductance element for electrically controlling impedance, and a plasma generator connected to the RF source via the matching box, for generating plasma by RF voltage outputted from the RF source, wherein the variable inductance element is connected between the RF source and the plasma generator, and wherein a target object disposed in the vacuum chamber is subjected to vacuum processing.

Furthermore, the present invention includes the vacuum apparatus, wherein the variable inductance element further comprises a main winding for determining the impedance of the variable inductance element, and a control winding magnetically coupled to the main winding, and wherein a magnitude of direct current flowing through the control winding controls the impedance of the main winding.

Furthermore, the present invention includes the vacuum apparatus, wherein the plasma generator comprises an ionization chamber, a coil wound around the ionization chamber, a first electrode disposed in an opening of the ionization chamber, and a second electrode disposed farther from the ionization chamber than the first electrode, wherein the plasma generator is an ion gun, and gas supplied to the ionization chamber forms plasma in an alternating current field formed by alternating current flowing through the coil; and positive ions extracted from the plasma by the first and second electrodes are released into the vacuum chamber.

Furthermore, the present invention is the vacuum apparatus further having an electron generator for emitting electrons, wherein when plasma is regenerated due to disappearance of the plasma, a voltage higher than that of the vacuum chamber is applied to the second electrode in order to attract the electrons emitted from the electron generator to the ionization chamber.

The present invention is a method of vacuum processing having the steps of ionizing gas supplied to an ionization chamber by applying an alternating current field to the gas to generate plasma, applying a positive voltage to a first electrode disposed in the vicinity of an opening of the ionization chamber, applying negative voltage to a second electrode disposed farther from the ionization chamber than the first electrode, releasing positive ions into a vacuum chamber, the positive ions being extracted from the plasma by an electric field formed by the first and second electrodes, releasing electrons from an electron generator into the vacuum chamber, to neutralize a flow of the positive ions by applying the electrons, and irradiating the neutralized positive ions to a target object disposed inside the vacuum chamber. When plasma is regenerated due to disappearance of the plasma, the electrons emitted from the electron generator are attracted into the ionization chamber by applying a voltage higher than that of the vacuum chamber to the second electrode.

According to the above-discussed present invention, it is possible to electrically control the impedance of a variable inductance element included in the matching box. Thus, since the impedance of the matching box is rapidly variable as compared to mechanical control, it is possible to shorten time for regenerating plasma.

In regenerating plasma, since electrons emitted from an electron generator are attracted into an ionization chamber, the electrons becomes the source of plasma regeneration so that it is possible to regenerate the plasma with ease.

DETAILED DESCRIPTION OF THE PREFERRED EMBODIMENTS

Figure 1:
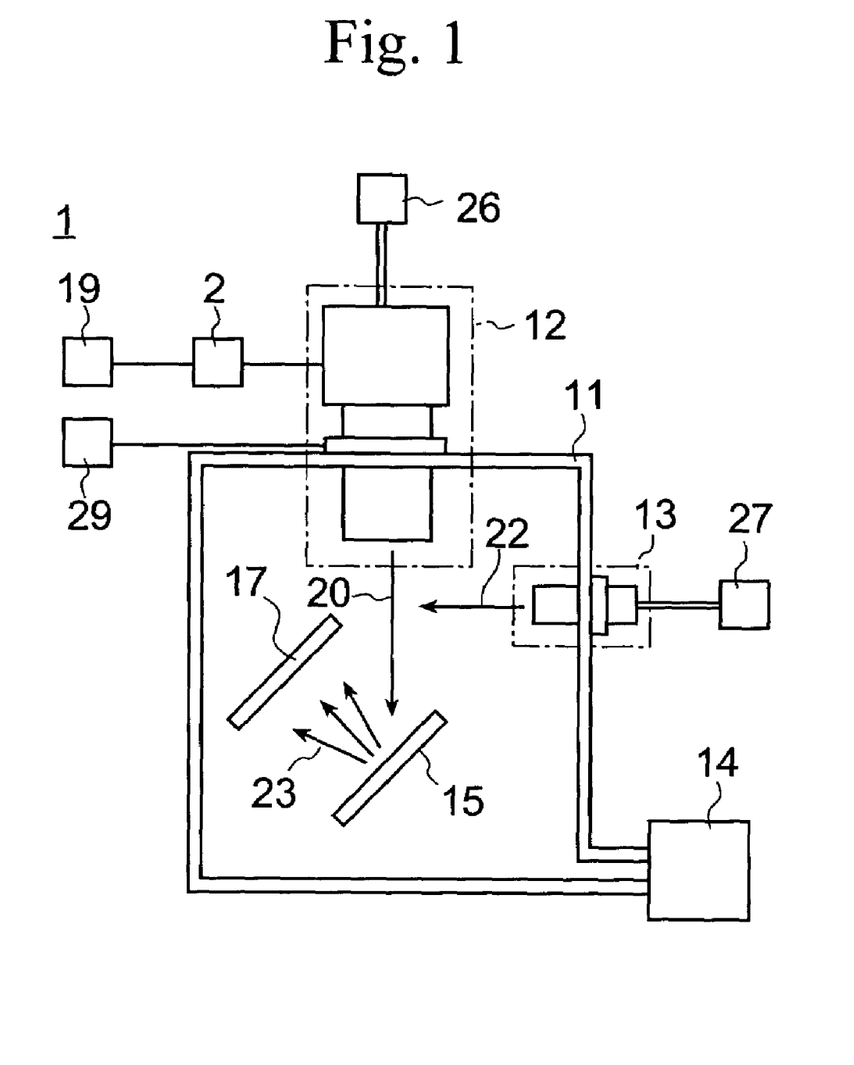
FIG. 1 is a schematic view of a vacuum apparatus according to the present invention.

FIG. 1 shows one embodiment of a vacuum apparatus according to the present invention, wherein the vacuum apparatus has a vacuum chamber 11. A plasma generator 12 and an electron generator (neutralizer) 13 are provided on the wall of the vacuum chamber 11. A RF source 19 and a DC voltage supply 29 are disposed outside of the vacuum chamber 11. The RF source 19 output high frequency AC power.

Figure 2:
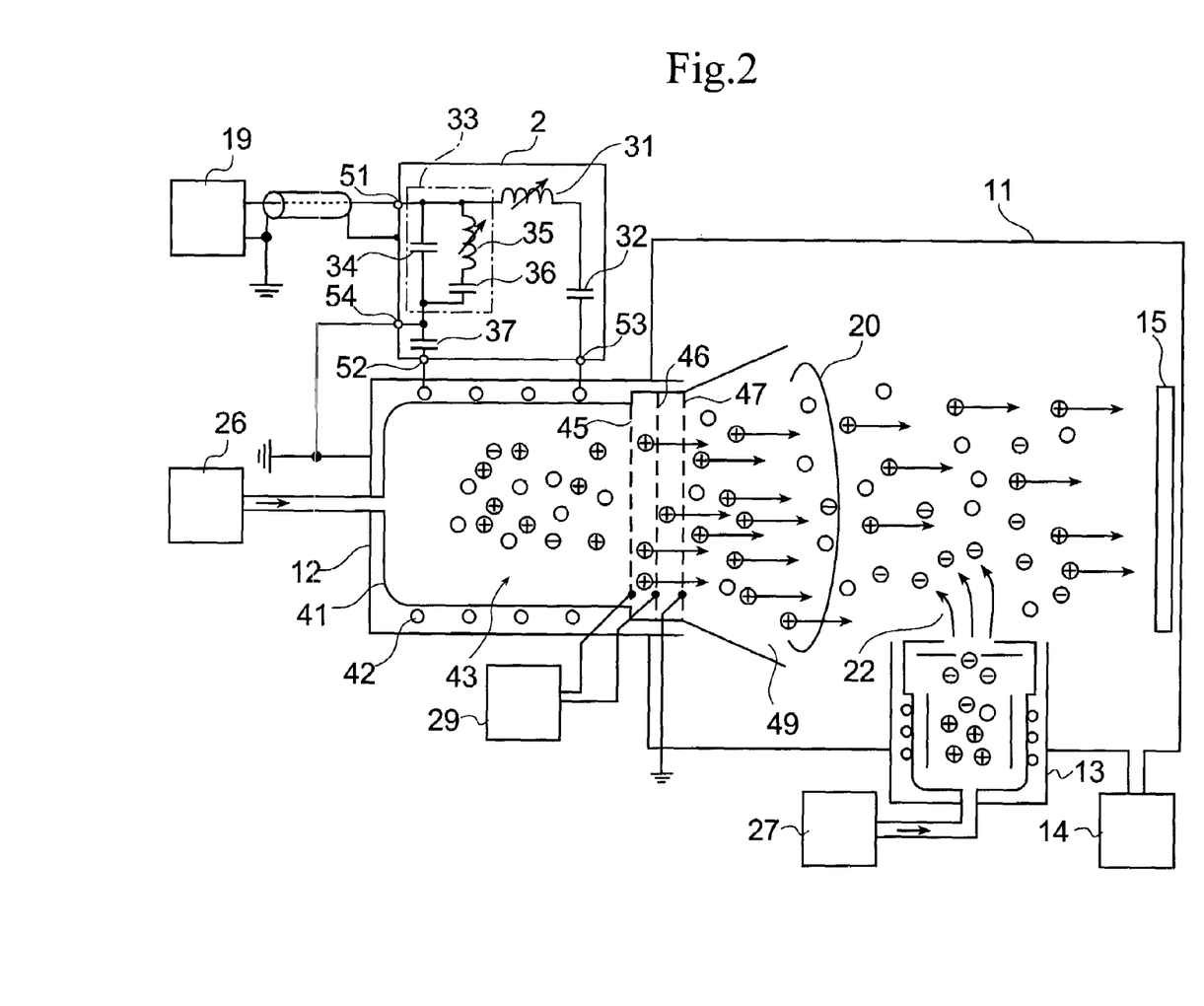
FIG. 2 is a detail drawing of a plasma generator and a matching box according to the present invention.

FIG. 2 shows the inside of the plasma generator 12 and a matching box 2.

The matching box 2 has an input terminal 51, a ground terminal 54, a ground side output terminal 52 and a high voltage side output terminal 53.

The ground terminal 54 of the matching box 2 is grounded, and the ground side output terminal 53 is connected to the ground terminal 54 via an internal circuit of the matching box 2 described later.

The input terminal 51 of the matching box 2 is connected to the RF source 19 with a shielding wire. When the RF source 19 outputs RF power, the internal circuit controls the magnitude and phase of the RF power. Then, the RF power is outputted from the high voltage side output terminal 53.

The plasma generator 12 of the vacuum apparatus 1 is an RF ion gun having an ionization chamber 41. A coil 42 is wound around the ionization chamber 41. One end of the coil 42 is connected to the high voltage side output terminal 53 of the matching box 2, and the other end thereof is connected to the ground side output terminal 52. The ground side output terminal 52 is connected to ground via a fourth capacitor 37, described later, of the matching box 2.

Accordingly, when RF voltage is applied from the high voltage side output terminal 53, alternating current flows through the coil 42 so that an alternating magnetic field (alternating current field) is formed in the ionization chamber 41.

The plasma generator 12 and the electron generator 13 are connected to gas supply systems 26 and 27, respectively, and the vacuum chamber 11 is connected to an evacuation system 14.

A substrate 17 as an object on which a film is to be deposited is disposed in the vacuum chamber 11; and then, the evacuation system 14 evacuates the inside of the vacuum chamber 11 to a predetermined pressure. Otherwise, the inside of the vacuum chamber 11 is evacuated in advance; and then, the substrate 17 is brought into the vacuum chamber 11 at vacuum conditions.

Consequently, gas is introduced into the ionization chamber 41 and the alternating current field is formed inside the ionization chamber 41 so that the introduced gas forms plasma. In FIG. 2, the reference numeral 43 indicates the plasma. The plasma 43 contains positive ions generated by the ionization of the introduced gas.

First to third electrodes 45, 46, and 47 are disposed in the vicinity of the opening of the ionization chamber 41 in this order from the side of the ionization chamber 41 to a spout 49.

The first and second electrodes 45 and 46 are connected to the DC voltage supply 29, respectively, so that the desired magnitude of voltage having arbitrary polarity can be applied thereto. In this embodiment, for example, voltages of +1.5 kV and −1 kV are applied to the first and second electrodes 45 and 46, respectively. The voltages, however, are not limited to these magnitudes.

The third electrode 47 is connected to the vacuum chamber 11 so as to have the same ground voltage (zero volt) as the vacuum chamber 11.

Many holes are formed in each of the first to third electrodes 45 to 47. When the positive ions contained in the plasma 43 enter between the first and second electrodes 45 and 46 through the holes, electric field formed by the first and second electrodes 45 and 46 accelerates the positive ions in the direction of the second electrode 46. Then, the positive ions converged by the third electrode 47 are released from the spout 49 into the vacuum chamber 11.

The reference numeral 20 indicates a flow of the positive ions (positive ion current) released into the vacuum chamber 11. The positive ion current 20 flies toward the target 15.

At this time, gas for ionization is introduced from the gas supply system 27 to the electron generator 13. When electrons generated by the ionization of the ionization gas introduced into the electron generator 13 are applied to the positive ion current 20, the electrons neutralize the positive ions. The reference numeral 22 indicates the electrons released from the electron generator 13.

Neutralization generates neutral particles. When the neutral particles are irradiated to the target 15, atoms of the target 15 are sputtered particles 23, and a thin film starts being formed on the surface of the substrate 17.

The impedance of an electric circuit composed of the coil 42 and the ionization chamber 41 varies between before and after the generation of plasma 43 in the ionization chamber 41. Accordingly, it is necessary to match the impedance by varying the impedance inside the matching box 2 when the plasma 43 is formed.

The configuration of the matching box 2 and method for matching the impedance will be hereinafter described.

The matching box 2 has first and second variable inductance elements 31 and 35 and first to fourth capacitors 32, 36, 34, and 37.

The input terminal 51 and the high voltage side output terminal 53 are connected to a series connected circuit, which is composed of the first variable inductance element 31 and the first capacitor 32 connected in series.

A grounded circuit 33 comprises a series connected circuit composed of the second variable inductance element 35 and the second capacitor 36 connected in series, and the third capacitor 34 connected in parallel with the series connected circuit. The input terminal 51 connected to the high voltage side output terminal 53 via the series connected circuit is also connected to the ground terminal 54 via the grounded circuit 33.

Accordingly, when the inductance magnitude of the first variable inductance element 31 is varied, the impedance between the input terminal 51 and the high voltage side output terminal 53 varies; and when the inductance magnitude of the second variable inductance element 35 is varied, the impedance between the input terminal 51 and the ground terminal 54 varies.

Figure 3A:
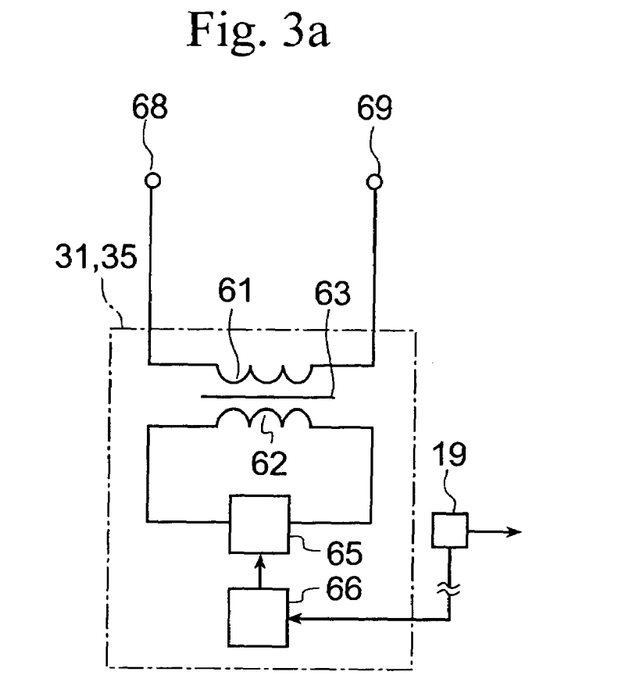
FIG. 3a is a schematic circuit diagram showing an internal circuit of a variable inductance element.

FIG. 3a is a schematic circuit diagram showing the internal configuration of the first and second variable inductance elements 31 and 35. The reference numerals 68, 69 designate terminals for connecting another circuit or terminal.

Each of the first and second variable inductance elements 31 and 35 has a main winding 61, a control winding 62, and a core 63.

The main winding 61 and the control winding 62 are magnetically coupled with each other via the core 63. In other words, when current flows through the control winding 62, magnetic flux penetrating the inside of the core 63 also penetrates the main winding 61.

The control winding 62 is connected to a control power source 65. Current outputted from the control power source 65 flows into the control winding 62. The control power source 65 is connected to a control circuit 66 so that the magnitude of direct current outputted to the control winding 62 is variable according to signals inputted from the control circuit 66.

Each of the control windings 62 of the first and second variable inductance elements 31 and 35 is connected to the different control power source 65. Each control power source 65 can supply a different magnitude of current to each of the control windings 62 of the first and second variable inductance elements 31 and 35. One control power source 65 may be provided as long as the power source 65 can supply desired magnitude of current to the first and second variable inductance elements 31 and 35.

Figure 3B:
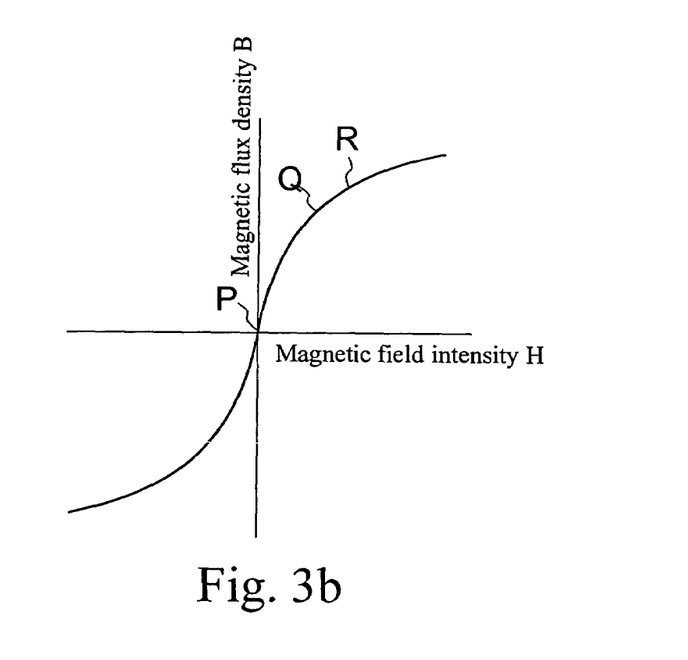
FIG. 3b is a graph explaining the principles of the internal circuit.

FIG. 3b is a graph showing the relationship between the magnetic field intensity and magnetic flux density of the main winding 61.

Points P, Q, and R are in the graph. Point P is in a case in which a current flowing through the control winding 62 is zero. Point Q is in a case in which a small current flows through the control winding 62; and point R is in a case in which a flowing current is larger than that of point Q.

The inductance of the main winding 61 in each point P, Q, or R is proportionate to the slope of the graph in each point P, Q, or R. Accordingly, the inductances in points P, Q, and R satisfy the following equation: point P>point Q>point R. As described above, the inductance of the main winding 61 becomes small when the large current flows through the control winding 62; and the inductance becomes large when the small current flows.

Thus, it is possible to control the inductance of the main winding 61 by varying the magnitude of direct current flowing through the control winding 62. Separately controlling the magnitudes of direct current flowing through the control windings 62 of the first and second inductance elements 31 and 35 makes it possible to electrically vary the impedance of the matching box 2 to a desired magnitude, in accordance with condition inside the ionization chamber 41, without using mechanical means (such as, a motor or the like).

More specifically, when the plasma 43 is generated in the ionization chamber 41, large input power is necessary. Accordingly, the inductance of the second variable inductance element 35 is increased to apply large voltage to the coil 42.

After the plasma 43 is formed once, the inductance of the second variable inductance element 35 is decreased so that the magnitude of voltage is optimally adjusted to stably maintain the plasma 43.

At this time, the control circuit 66 measures the phases and current of voltage outputted from the RF source 19. Then, when the control circuit 66 varies the magnitude of current flowing through the control winding 62, the phase and voltage of the current flowing through main winding 61 is shifted. Consequently, the magnitude of inductance of the first variable inductance element 31 varies in order to make the difference between the phase of current flowing through coil 42 and the phase of voltage applied to coil 42 zero. Therefore, the input power is efficiently used for forming the plasma.

There is a case in which the thin film deposition is interrupted due to the disappearance of the plasma 43 inside the ionization chamber 41, after the plasma 43 is generated once.

In the present invention, the control circuit 66 measures the current flowing through the coil 42. In detecting the disappearance of the plasma 43 by a measurement magnitude of the current, the impedance of the first and second variable inductance elements 31 and 35 is returned to that before the generation of the plasma. In addition, the voltage of the second electrode 46 is changed from a negative voltage to a voltage equal to or higher than zero volt and lower than the voltage of the first electrode 45, while a positive voltage is continuously applied to the first electrode 45.

When the electrons are released from the electron generator 13 under this condition, the electrons attracted to the second electrode 46, and get into the ionization chamber 41. Since the inside of the ionization chamber 41 becomes easy to discharge due to the presence of the electrons therein, the plasma is easily generated again when the RF voltage is applied to the coil 42.

According to the present invention, the down time of the plasma 43 between the disappearance and regeneration thereof is less than 100 mS so that the down time does not adversely affect film thickness accuracy.

In an instance where a laminated film having the thickness of 5000 Angstrom is formed by laminating 100 layers of thin films, for example, the thickness per layer is 50 Angstrom. When the thickness of each layer is the same, if the film thickness accuracy of 100 layers is less than ±0.001%, the allowable deviation of film thickness per layer is less than 0.5 Angstrom.

If film deposition speed is 0.1 Angstrom per second, it takes 13.9 hours by simple arithmetic to deposit the films to 5000 Angstrom. If the film deposition stops only 5 seconds, the deviation of the film thickness reaches the allowable deviation of 0.5 Angstrom. Thus, the limit down time is 5 seconds.

In fact, the required film thickness of each layer is not equal. To practically satisfy requirements of various processes, the down time must be more than ten times as short as the limit of down time described above. Furthermore, if several times of stop are allowed, the down time must be practically 100 mS or less, as described with respect to the present invention.

Figure 4:
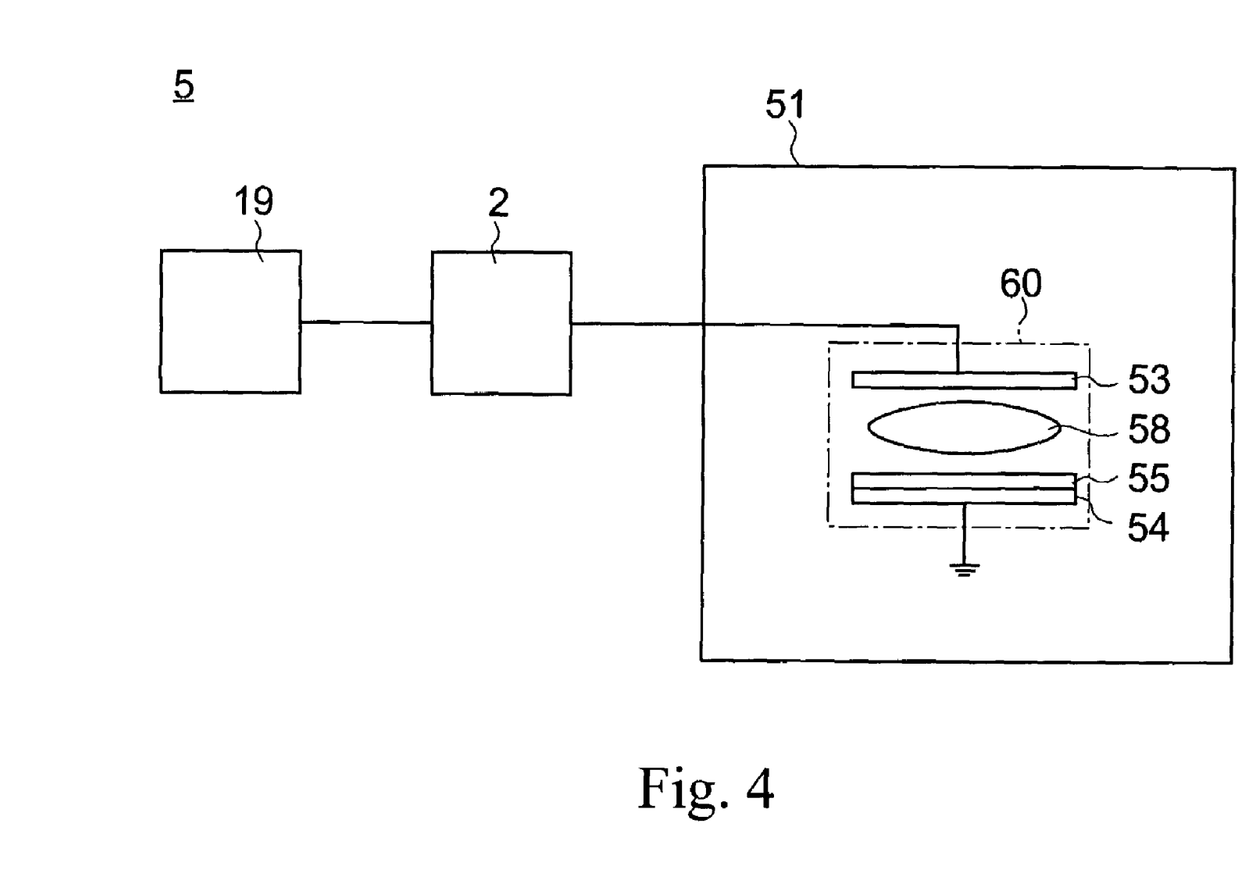
FIG. 4 is a schematic view of a vacuum apparatus according to another embodiment of the present invention.

In this embodiment, the plasma generator 12 is the RF ion gun, and the vacuum apparatus is a sputtering apparatus. The vacuum apparatus according to the present invention, however, is not limited thereto. In FIG. 4, for example, the reference numeral 5 is an etching apparatus, and a plasma generator 60 is disposed in a vacuum chamber 51.

The plasma generator 60 includes first and second opposite electrodes 53 and 54. The first opposite electrode 53 is connected to the RF source 19 via the matching box 2, and the second opposite electrode 54 is connected to the ground voltage.

When the RF voltage outputted from the RF source 19 and matched in the matching box 2 is applied to the first and second opposite electrodes 53 and 54, the plasma 58 is formed. The plasma 58 etches a substrate 55.

As described above, the magnitudes of inductance of the first and second variable inductance elements 31 and 35 are electrically varied to control the impedance of the matching box 2.

Conventionally, a process has ended in failure if the discharge stops only one time. According to the present invention, since the process ends successfully, it is possible to, for example, reduce the number of failure of film deposition in manufacturing a narrow-band filter over several tens of hours.

What is claimed is:

1. A vacuum apparatus comprising:
    a vacuum chamber;
    an RF source;
    a plasma generator;
    a detecting device for detecting disappearance of plasma; and
    first and second variable inductance elements,
    wherein the first variable inductance element comprises:
        a first main winding, and
        a first control winding magnetically coupled to the first main winding,
    wherein the second variable inductance element comprises:
        a second main winding, and
        a second control winding magnetically coupled to the first main winding,
    wherein the first and second main windings are controlled based on a magnitude of direct current flowing through the first and second control windings respecitvely,
    wherein the RF source is connected to the plasma generator via the first main winding and the RF source is connected to ground voltage via the second main winding,
    wherein the plasma generator generates plasma by RF voltage outputted from the RF source, and
    wherein when the disappearance of plasma is detected by the detecting device, the direct current flowing through the second control winding is decreased in order to increase the inductance of the second main winding larger than its inductance when plasma is maintained, and then, the RF voltage outputted to the plasma generator is increased.

2. The vacuum apparatus according to claim 1, wherein when the plasma is maintained, magnitude of the inductance of the first main winding is controlled by the direct current flowing through the first control winding.

3. The vacuum apparatus according to claim 1, wherein said plasma generator comprises:
    an ionization chamber;
    a coil wound around said ionization chamber;
    a first electrode disposed in an opening of said ionization chamber; and
    a second electrode disposed farther from said ionization chamber than said first electrode,
    wherein said plasma generator is an ion gun, and gas supplied to said ionization chamber forms plasma in an alternating current field formed by alternating current flowing through said coil, and positive ions extracted from said plasma by said first and second electrodes are released into said vacuum chamber.

4. The vacuum apparatus according to claim 3, further comprising an electron generator for emitting electrons,
    wherein when plasma is regenerated due to disappearance of said plasma, a voltage higher than that of said vacuum chamber is applied to said second electrode in order to attract said electrons emitted from said electron generator to said ionization chamber.

* * * * *